United States Patent [19]

Schinhärl

[11] Patent Number: 5,097,214
[45] Date of Patent: Mar. 17, 1992

[54] METHOD AND APPARATUS FOR DETERMINING THE PROPERTIES OF AN INSULATION LAYER BY MAINTAINING AN OUTPUT CURRENT RATIO GENERATED BY DIRECTING IONS AT THE INSULATION LAYER

[76] Inventor: Kurt Schinhärl, Tassilostrasse 30, 8440 Straubing, Fed. Rep. of Germany

[21] Appl. No.: 589,274

[22] Filed: Sep. 28, 1990

[30] Foreign Application Priority Data

Sep. 29, 1989 [DE] Fed. Rep. of Germany ....... 3932572

[51] Int. Cl.⁵ ............................................ G01R 31/12
[52] U.S. Cl. ..................... 324/554; 324/551; 324/557
[58] Field of Search ............... 324/551, 501, 554, 557, 324/558, 452, 456

[56] References Cited

U.S. PATENT DOCUMENTS

| | | | |
|---|---|---|---|
| 3,639,831 | 2/1972 | Cushman | 324/55 X |
| 4,740,862 | 4/1988 | Halleck | 324/455 X |
| 4,891,597 | 1/1990 | Asars | 324/557 |

*Primary Examiner*—Jack B. Harvey
*Attorney, Agent, or Firm*—Hoffman, Wasson & Gitler

[57] ABSTRACT

A method and apparatus for determining the properties of a particular insulation layer wherein an ion source is directly at the insulation layer. An electrode is provided between the insulation layer mounted on a support, and the ion source. A voltage U is generated across the electrode and the support and a particular current ratio is maintained between the electrode, the voltage generator and the support by adjusting the voltage U. The time behavior of this voltage U would determine the properties of the insulation layer.

13 Claims, 2 Drawing Sheets

METHOD AND APPARATUS FOR DETERMINING THE PROPERTIES OF AN INSULATION LAYER BY MAINTAINING AN OUTPUT CURRENT RATIO GENERATED BY DIRECTING IONS AT THE INSULATION LAYER

FIELD OF THE INVENTION

The invention relates to a process for determining the properties of an insulation layer whose one surface side is connected to an insulation support made of electrically conductive material, as well as to an arrangement for performing the process.

BACKGROUND OF THE INVENTION

It is necessary and usual, especially in semiconductor manufacturing, to determine the properties and thus specifically the breakdown behavior of insulation layers (Dr. R. Wolters, "On Dielectric Breakdown in Oxidized Silicon," Journal Vac. Sci. Technologie, A. vol. 5, No. 4, pp 1563-1568). The corresponding measurements are performed on semiconductor control wafers provided with the corresponding insulation layer. The process of the prior art consists of initially applying numerous contact surfaces consisting of an electrically conductive material to the surface side of the control wafer provided with the insulation layer. These contact surfaces are electrically insulated from one another. Each contact surface forms, with an electrically conductive insulation support, in this case with the semiconductor wafer, a capacitor. The breakdown field strength is determined on each capacitor by a common connection to the electrically conductive insulation support and by an electrode with which an electrical contact to each individual contact surface can be produced. The statistical distribution of the values of the breakdown field strengths obtained this way can then indicate the breakdown behavior of the insulation layer. This process is very time-consuming.

The object of the invention is to indicate a process with which the properties of insulation layers is determined without contacts and at considerably faster speed. Further, an arrangement to perform the process is to be provided.

SUMMARY OF THE INVENTION

The essence of the process according to the invention, which makes it possible quickly and without contact to characterize the properties of insulation layers or to determine the breakdown behavior of such layers, consists of the fact that ions are continuously deposited on the exposed surface side of the respective insulation layer and, in doing so, at the same time the average surface potential produced is determined. As long as no current flows through the insulation layer, the surface potential rises in proportion to time. With increasing current flow through the insulation layer, this rise becomes less, or flatter, until the potential of the surface assumes a saturated value. The breakdown behavior of the insulation layer is apparent from this time behavior.

In the invention, the output current distribution takes into consideration essentially the geometry and positioning of the essential elements of the measuring arrangement. In semiconductor insulation layers, the insulation support is the semiconductor substrate on which the insulation layer is made or produced.

BRIEF DESCRIPTION OF THE DRAWINGS

The invention is explained in more detail below based on FIGS. 1 and 2, each of which shows an arrangement for performing the process according to the invention in a diagrammatic representation.

DETAILED DESCRIPTION OF THE INVENTION

Figure 1:
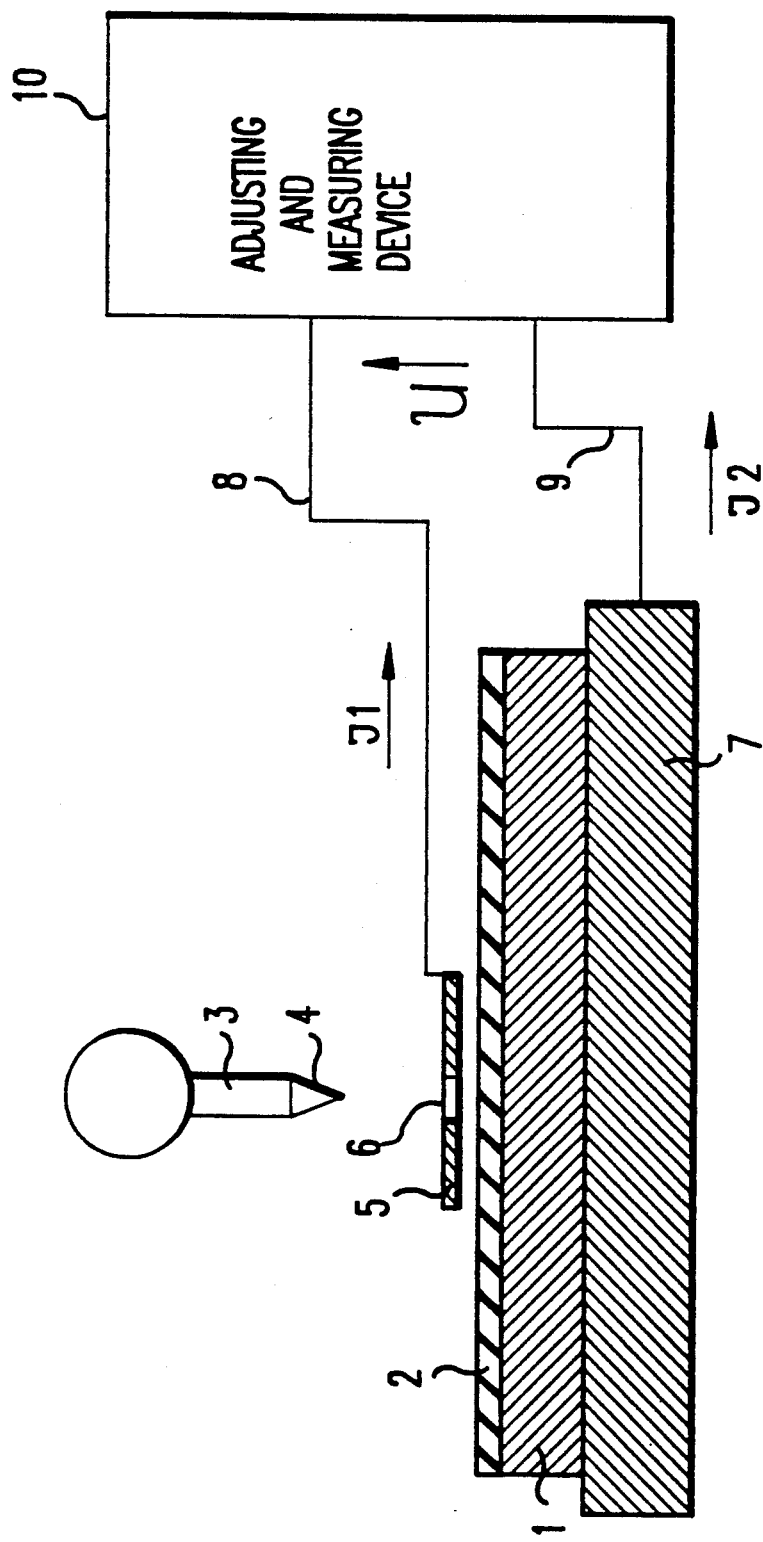

In the figures, 1 is an electrically conductive insulation support in the form of a semiconductor chip or semiconductor wafer. On the top surface side in the figures, insulation support 1 is provided with an insulation layer 2 whose properties or breakdown behavior is to be determined.

For this purpose, the arrangement represented in figure is used, for example, in which there is provided above insulation layer 2 an electrode 3 whose tapering end 4 facing insulation layer 2 is at a distance from the top side of insulation layer 2. Between end 4 and the insulation layer, there is provided a plate 5 that is made of a suitable metallic material and that is at a preselected distance from the top side of insulation layer 2 and has a plate opening 6 whose center axis lies perpendicular to the top side of insulation layer 2 and lies aligned with the axis of electrode 3.

Insulation support 1 is held with its lower surface side on the top side of an electrically conductive, plate-shaped mount (7) (measuring table). Mount 7 and a holder, not shown in more detail, for electrode 3 and plate 5 can be moved relative to one another so that at least all areas of interest on insulation layer 2 can be positioned under electrode 3 or plate 5. Lines 8 and 9 connect plate 5 or the electrically conductive top side of mount 7 to an adjusting and measuring device 10.

Electrode 3 is used as a ion source and, for the measuring operation or for the determination of the insulation properties of insulation layer 2, is acted on with a high voltage, for example with a voltage of about 5-8 kV in magnitude, so that this electrode 3 is excited to a corona discharge. The corona current flowing here, whose magnitude can be adjusted by changing the distance of end 4 from the top side of insulation layer 2, is divided into two currents I1 in line 8 and I2 in line 9. Adjusting and measuring device 10 has, among other things, means of generating, between two lines 9 and 8, a voltage U whose magnitude is adjusted in the way described in more detail below as a function of currents I1 and I2.

Before the measurement of insulation layer 2, instead of insulation support 1 exhibiting this insulation layer, first a test specimen not exhibiting insulation layer 2 but rather corresponding to insulation support 1 is placed on mount 7. After turning on the high voltage source, both currents I1 and I2 or their ratio is determined as the output current ratio.

In the subsequent characterization or measurement of insulation layer 2, voltage U is adjusted by adjusting and measuring device 10 so that original output current ratio I1/I2 is maintained. The breakdown behavior of insulation layer 2 can be determined from the time behavior of voltage U.

Figure 2:
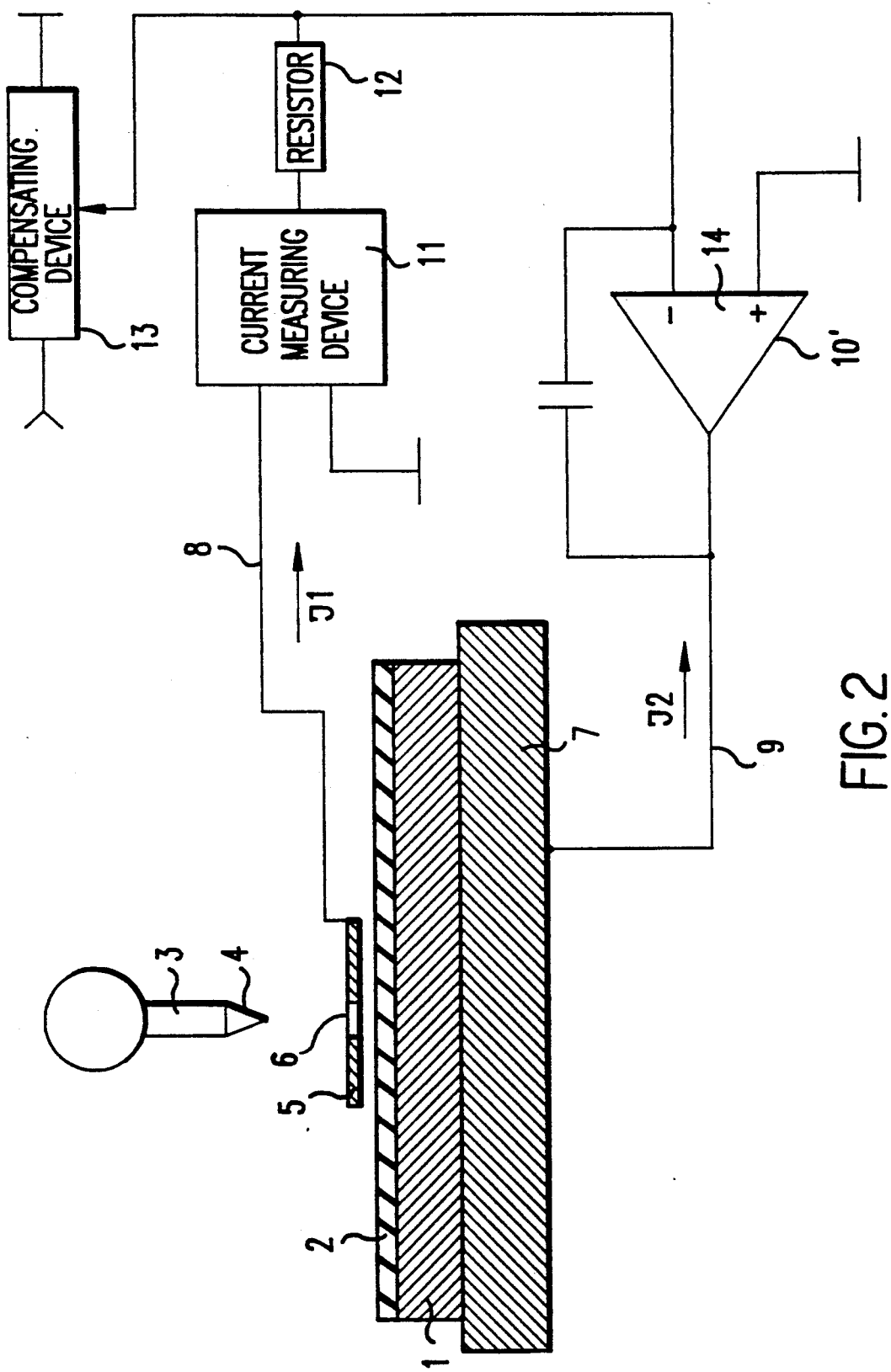

FIG. 2 shows an embodiment in which only current I1 flowing in line 8 is measured or detected by adjusting or measuring device 10' and, as a function of this, voltage U is adjusted so that original output current ratio I1/I2 is maintained. In line 8 leading to the ground, a current measuring device 11 is provided whose output is connected by a resistor 12 on the one hand to a compensating device 13 and on the other hand to the negative input of an operational amplifier 14 whose positive input is grounded. In the embodiment represented, compensating device 13 is made of a read-out potentiometer that lies between the ground and a constant bias and whose sliding contact is connected to the output of device 11 by resistor 12. The output of operational amplifier 14 is connected to electrically conductive mount 7.

To adjust the output current ratio, compensating device 13 or the sliding contact of the corresponding potentiometer is adjusted so that all current delivered by device 11 at the output flows into compensating device 13. Thus the current distribution determined by the geometry of electrode 3, plate 5 and the arrangement of these elements takes into account for both lines 8 and 9.

During the measurement of insulation layer 2, the control loop comprising device 11, compensating device 13 and operational amplifier 14 readjusts voltage U so that the original current ratio is maintained. The breakdown behavior of insulation layer 2 is in turn apparent from the time behavior of voltage U.

In both above-described arrangements, the process is performed in air in each case, preferably in a protective gas atmosphere.

The invention was described above based on embodiments. Of course changes and modifications are possible without leaving the scope and nature of the invention on which the invention is based. Thus it is also possible, for example, to use, instead of electrode 3 acted on with the high voltage, another suitable ion source, for example one in which the air or the gas of the atmosphere in which the measurement is performed is ionized by radioactive irradiation.

I claim:

1. A method for determining the properties, including the amount of breakdown voltage, of an insulation layer comprising the steps of
    subjecting a preselected measurement area of an insulation support to ions produced by an ion source placed above said insulation support;
    placing an electrode over said preselected measurement area at a preselected distance above said insulation support and below said ion source;
    determining an output current ratio (I1/I2) between the current of said electrode and the current of said insulation support;
    providing an insulation layer on a first side of said insulation support;
    subjecting a preselected measurement area on the second side of the insulation layer to ions produced by said ion source placed above the insulation layer;
    placing an electrode over said preselected measurement area at a preselected distance above the insulation layer and below said ion source;
    generating a voltage U across said insulation support and said electrode, said generating step provided by an adjusting and generating device;
    adjusting voltage U such that said output current ratio I1/I2 between said electrode, said insulation support and said adjusting and generating device maintained; and
    determining the properties, including the amount of breakdown voltage, of the insulation layer based upon the time behavior of voltage U.

2. The method in accordance with claim 1, wherein said preselected measurement area can be moved over the surface of the insulation layer.

3. The method in accordance with claim 2 wherein said ion source and said insulation layer are moved with respect to one another.

4. The method in accordance with claim 1 wherein the determination of the properties of the insulation layer is carrier out in a non-vacuum atmosphere.

5. The method in accordance with claim 1, wherein said electrode consists of a plate provided with an opening therein.

6. The method in accordance with claim 1, wherein said ion source produces high voltage corona discharge.

7. The method in accordance with claim 1, wherein said output current ratio is automatically adjusted.

8. An apparatus for determining the properties of an insulation layer, including the amount of breakdown voltage, comprising:
    a support mount for mounting insulation layer thereon;
    an ion source provided above said support mount;
    an electrode provided between said insulation layer and said ion source; and
    a device connected between said support mount and said electrode for generating a voltage U therebetween and for maintaining a ratio I1/I2 initially measured between said support mount without said insulation layer and said electrode, said voltage U used to determine the properties of said insulation layer, including the amount of breakdown voltage of said insulation layer.

9. The apparatus in accordance with claim 8 wherein said ion source and said electrode are movable with respect to said support mount and further wherein said support mount is movable with respect to said ion source and said electrode.

10. The apparatus in accordance with claim 8, wherein said electrode consists of a plate having an opening therein.

11. The apparatus in accordance with claim 8, wherein said ion source produces a high voltage corona discharge.

12. The apparatus in accordance with claim 8, wherein said device includes a voltage source, a current measuring device and an output compensating device for maintaining I1/I2, said voltage source connected to said current measuring device and said output compensating device.

13. The apparatus in accordance with claim 12, wherein said voltage source is an operational amplifier.

* * * * *